United States Patent [19]
Jung

[11] Patent Number: 6,104,656
[45] Date of Patent: Aug. 15, 2000

[54] SENSE AMPLIFIER CONTROL CIRCUIT IN SEMICONDUCTOR MEMORY

[75] Inventor: Tae-Hyung Jung, Chungcheongbuk, Rep. of Korea

[73] Assignee: Hyundai Microelectronics Co., Ltd., Chungcheongbuk-Do, Rep. of Korea

[21] Appl. No.: 09/422,063

[22] Filed: Oct. 21, 1999

[30] Foreign Application Priority Data

Jun. 9, 1999 [KR] Rep. of Korea .................. 99-21334

[51] Int. Cl.$^7$ .................. G11C 7/02; G11C 7/00
[52] U.S. Cl. .................. 365/207; 365/205; 365/194
[58] Field of Search .................. 365/207, 205, 365/194

[56] References Cited

U.S. PATENT DOCUMENTS

| | | | |
|---|---|---|---|
| 5,572,475 | 11/1996 | Yim et al. | 365/205 |
| 5,594,695 | 1/1997 | Yim et al. | 365/205 |
| 5,646,899 | 7/1997 | Jang et al. | 365/205 |
| 5,729,499 | 3/1998 | Fujiwara et al. | 365/207 |
| 5,737,273 | 4/1998 | Fujiwara et al. | 365/205 |
| 5,754,010 | 5/1998 | Caravella et al. | 365/203 |
| 5,764,580 | 6/1998 | Suzuki et al. | 365/205 |
| 5,963,496 | 10/1999 | Pathak et al. | 365/207 |

*Primary Examiner*—Son T. Dinh
*Assistant Examiner*—Anh Phung
*Attorney, Agent, or Firm*—Morgan, Lewis & Bockius LLP

[57] ABSTRACT

A sense amplifier control circuit in a semiconductor memory supplies a sense amplifier with two power source voltages with voltage levels different from each other, successively. A first logic gate is supplied with a pair of sense amplifier enabling bar signals which are applied to the first logic gate in order. The first logic gate generates a signal of logic value 0 when at least one of the sense amplifier enabling bar signals has logic value 1. A second logic gate generates a first NMOS sense amplifier enabling bar signal of high level when an output of the first logic gate has logic value 0 and a sense amplifier enabling bar signal has logic value 1. A third logic gate generates a first PMOS sense amplifier enabling bar signal of high level when at least one of an output of the first logic gate and a sense amplifier enabling bar signal has logic value 1. A fourth logic gate generates a signal of logic value 1 when at least one of a plurality of MAT selection bar signals has logic value 0. A fifth logic gate generates a signal of logic value 1 when the first NMOS sense amplifier enabling bar signal has logic value 0 and an output of the fourth logic gate has logic value 1. A sixth logic gate generates a signal of logic value 0 when the first PMOS sense amplifier enabling bar signal has logic value 1 and an output of the fourth logic gate has logic value 0, and a seventh logic gate generates a second PMOS sense amplifier control signal of logic value 1 when the outputs of the fifth and sixth logic gates both have logic value 1.

14 Claims, 7 Drawing Sheets

SENSE AMPLIFIER CONTROL CIRCUIT IN SEMICONDUCTOR MEMORY

BACKGROUND OF THE INVENTION

1. Field of Invention

The present invention relates to semiconductor memory, more particularly, to a sense amplifier control circuit in semiconductor memory which supplies a sense amplifier with two power source voltages of which levels are different each other, successively.

2. Discussion of Related Art

A sense amplifier in semiconductor memory basically amplifies the voltage difference between a pair of bit lines. The sense amplifier amplifies the voltage difference, carrying out operations of data read/write and data refresh in memory cells. Various operations of the sense amplifier are controlled by a separate circuit for controlling a sense amplifier.

Figure 1:
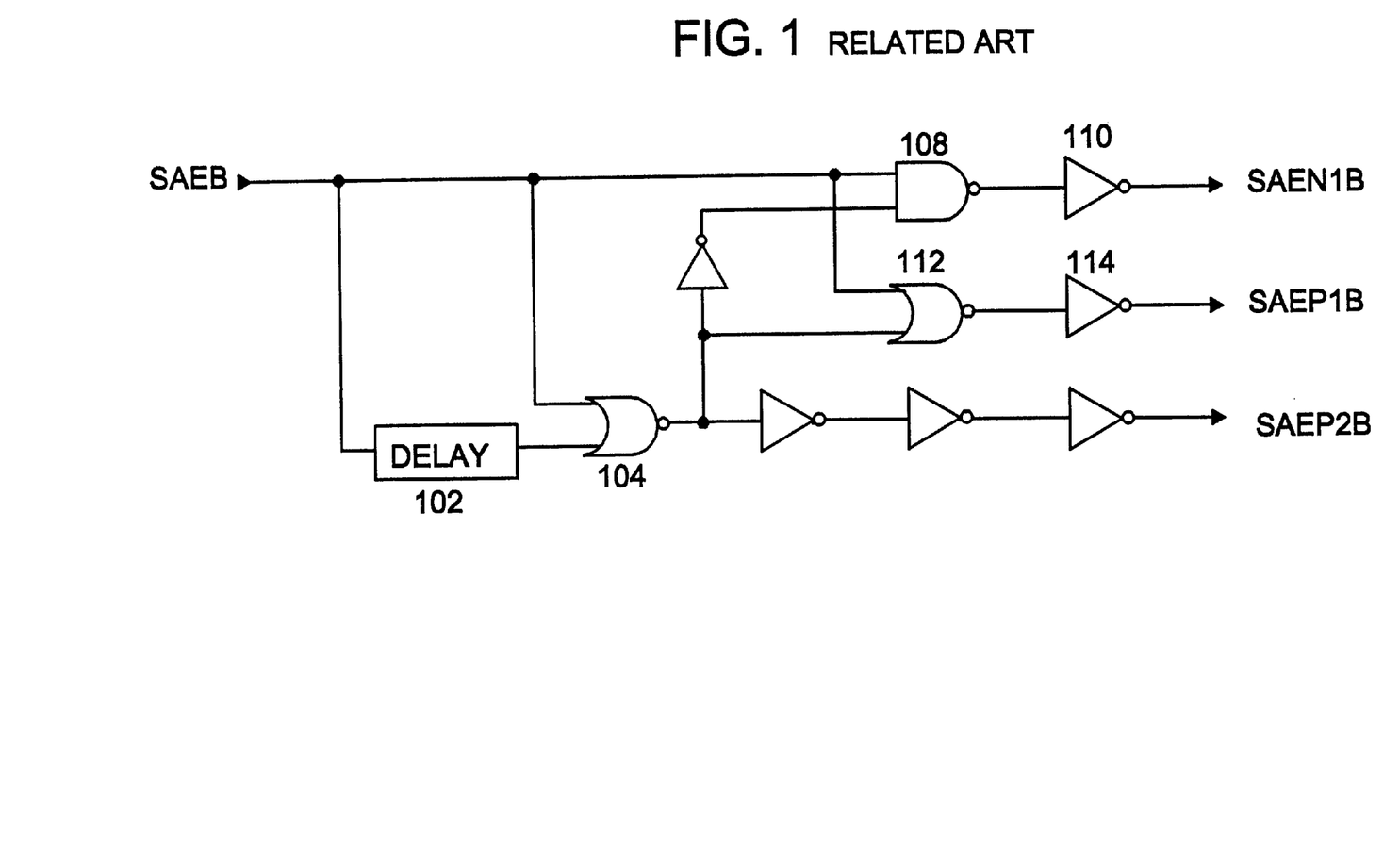
FIG. 1 and FIG. 2 show sense amplifier control circuits in semiconductor memory according to a related art.
Figure 2:
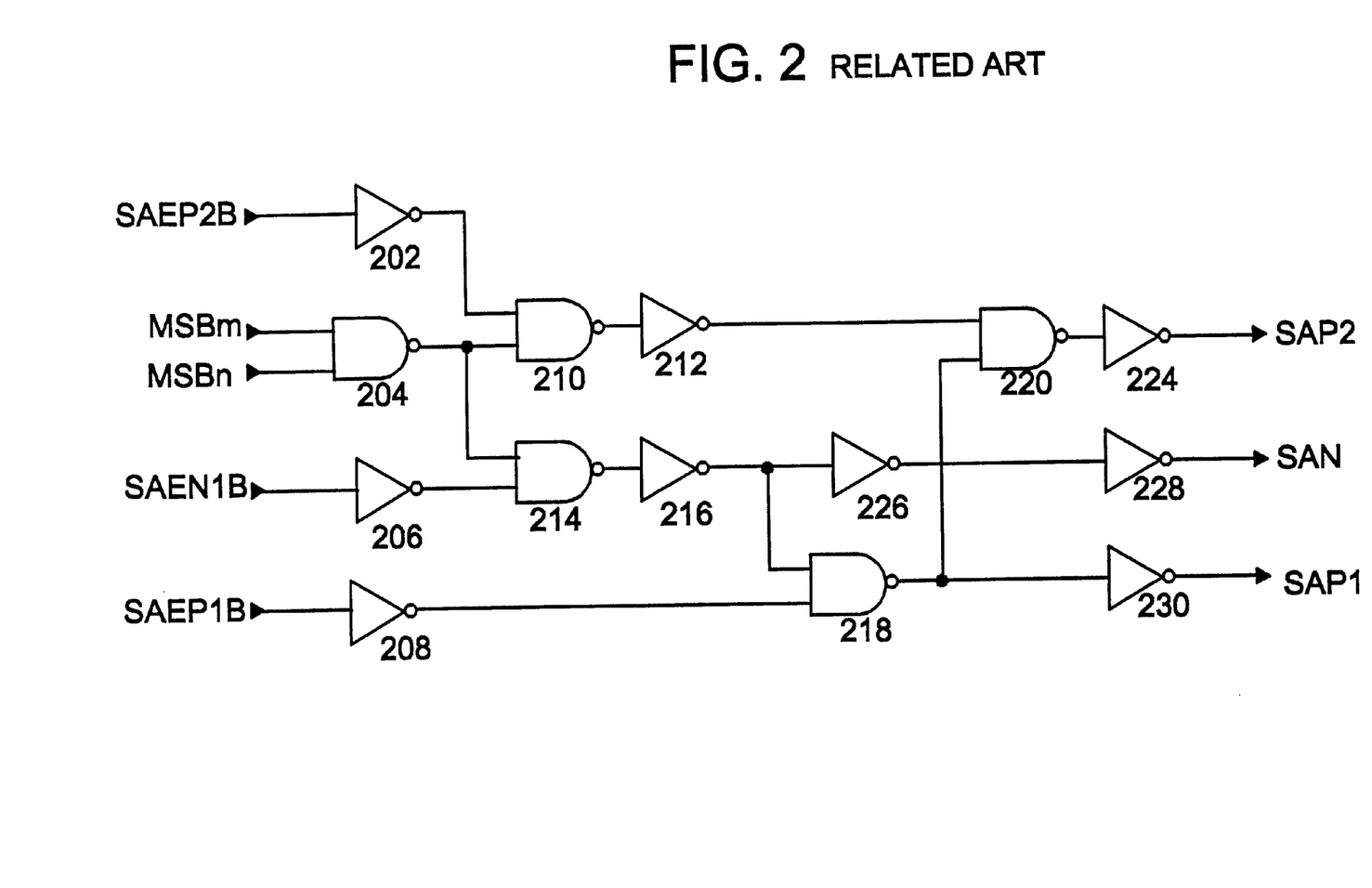

FIG. 1 and FIG. 2 show sense amplifier control circuits in semiconductor memory according to a related art.

FIG. 1 is a circuit for generating a first NMOS sense amplifier enabling bar signal SAEN1B, first PMOS sense amplifier enabling bar signal SAEP1B, and second PMOS sense amplifier enabling bar signal SAEP2B in use of a sense amplifier enabling bar signal SAEB.

FIG. 2 is a circuit for generating an NMOS sense amplifier control signal SAN, first PMOS sense amplifier control signal SAP1, and second PMOS sense amplifier control signal SAP2 in use of the signals generated in FIG. 1.

Referring to FIG. 1, a delaying part 102 receives and delays a sense amplifier enabling bar signal SAEB for a time interval. A NOR gate 104 receives the sense amplifier enabling bar signal SAEB and an output of the delaying part 102. A NAND gate 108 receives an inverted signal of an output of the NOR gate 104 and the sense amplifier enabling bar signal SAEB. An inverter 110 outputs a first NMOS sense amplifier enabling bar signal SAEN1B by inverting an output of the NAND gate 108. A NOR gate 112 receives the output of the NOR gate 104 and the sense amplifier enabling bar signal SAEB. An inverter 114 outputs a first PMOS sense amplifier enabling bar signal SAEP1B by inverting an output of the NOR gate 112. Three inverters connected one another in series output a second PMOS sense amplifier enabling bar signal SAEP2B by delaying and inverting the output of the NOR gate 104.

Referring to FIG. 2, an inverter 202 inverts the second PMOS sense amplifier enabling bar signal SAEP2B. A NAND gate 204 receives a plurality of mat selection bar signals MSBm and MSBn. An inverter 206 inverts the first NMOS sense amplifier enabling bar signal SAEN1B. An inverter 208 inverts the first PMOS sense amplifier enabling bar signal SAEP1B. A NAND gate 210 receives outputs of the inverter 202 and NAND gate 204. An inverter 212 inverts an output of the NAND gate 210. A NAND gate 214 receives outputs of the NAND gate 204 and inverter 206. An inverter 216 inverts an output of the NAND gate 214.

A NAND gate 218 receives outputs of the inverters 216 and 208 respectively. A NAND gate 220 receives outputs of the inverter 212 and NAND gate 218. An inverter 224 outputs a second PMOS sense amplifier control signal SAP2 by inverting an output of the NAND gate 220. Two inverters 226 and 228 connected each other in series delays an output of the inverter 216, generating an NMOS sense amplifier control signal SAN. An inverter 230 generates a first PMOS sense amplifier control signal SAP1 by inverting an output of the NAND gate 218.

Figure 3:
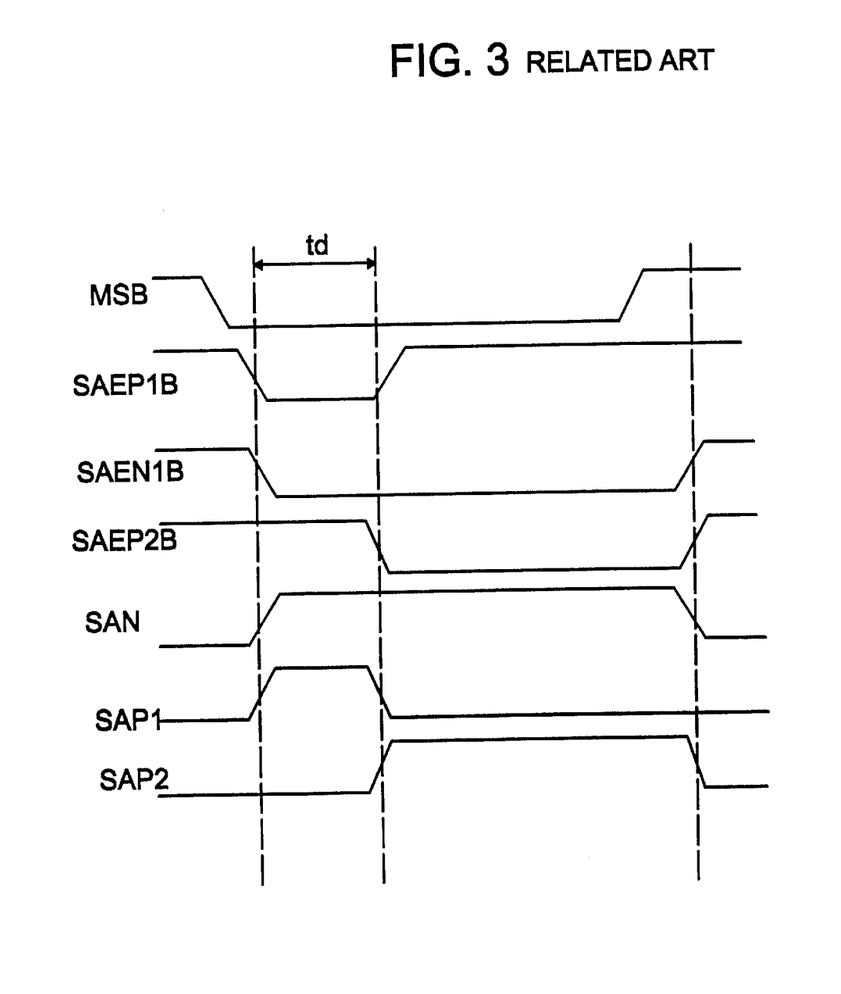
FIG. 3 shows a timing diagram of operational characteristics of a sense amplifier control circuit in semiconductor memory of a related art.

FIG. 3 shows a timing diagram of operational characteristics of a sense amplifier control circuit in semiconductor memory of a related art.

Referring to FIG. 3, when a mat selection bar signal MSB goes down high level to low, a sense amplifier enabling bar signal SAEB goes down to low level. Provided that the sense amplifier enabling bar signal SAEB goes down to low level, Both first PMOS and NMOS sense amplifier enabling bar signals SAEP1B and SAEN1B go down to low level while a second PMOS sense amplifier enabling bar signal SAEP2B still maintains high level.

After delayed time td of the delaying part 102 has elapsed, the first sense amplifier enabling bar signal SAEP1B goes up to high level again and the second PMOS sense amplifier enabling bar signal SAEP2B goes down to low level, while the first NMOS sense amplifier enabling bar signal SAEN1B maintains low level.

As the first NMOS sense amplifier enabling bar signal SAEN1B goes down to low level, an NMOS sense amplifier control signal SAN goes up to high level. While the first sense amplifier enabling bar signal SAEP1B stay at low level, a first PMOS sense amplifier control signal SAP1 keeps high level. While the second PMOS sense amplifier enabling bar signal SAEP2B stays at low level, a second PMOS sense amplifier control signal SAP2 is at high level. As shown in FIG. 3, the first and second PMOS sense amplifier control signals SAP1 and SAP2 are activated to high level in order. The activated interval of the first PMOS sense amplifier control signal SAP1 is relatively shorter than that of the second SAP2. This is because the sense amplifier is supplied with normal voltage through the second PMOS sense amplifier control signal SAP2 after the driving force of the sense amplifier has been greatly improved owing to overdriven voltage applied to the sense amplifier by the first PMOS sense amplifier control signal SAP1.

Figure 4:
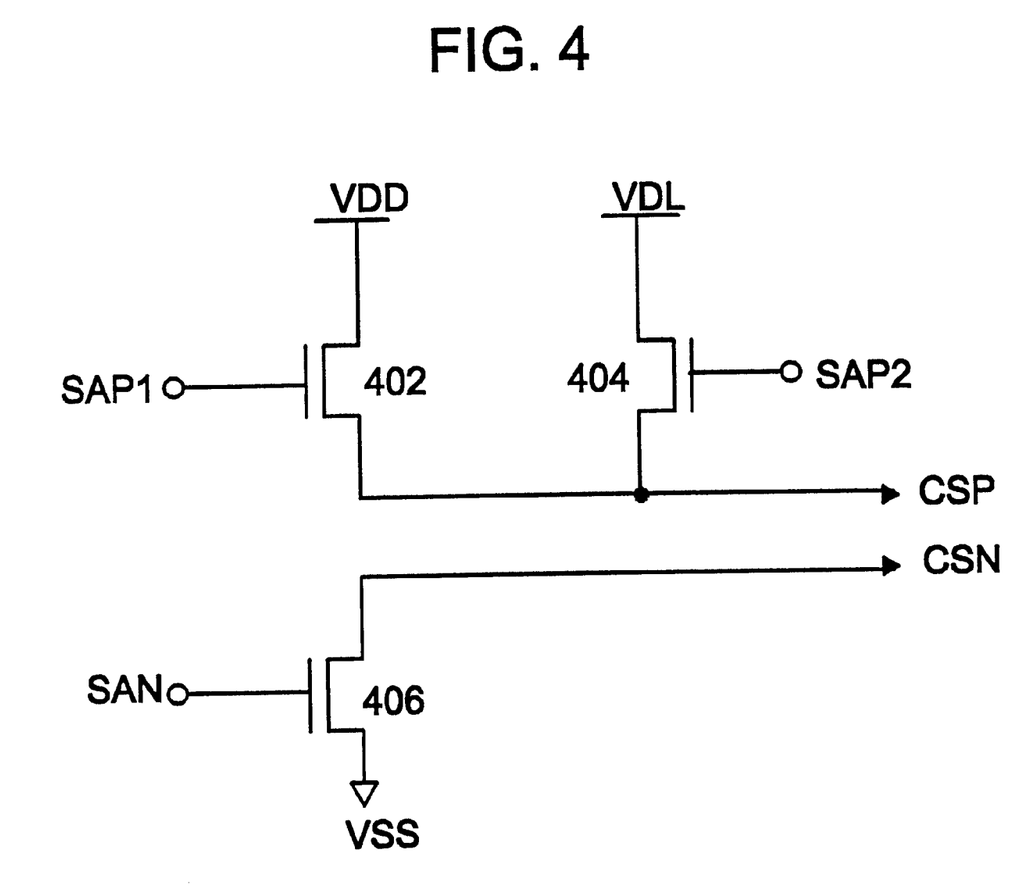
FIG. 4 shows a sense amplifier driving circuit in semiconductor memory.

FIG. 4 shows a sense amplifier driving circuit in semiconductor memory.

Referring to FIG. 4, two NMOS transistors 402 and 404 are controlled by a first PMOS sense amplifier control signal SAP1 and a second PMOS sense amplifier control signal SAP2, respectively. Another NMOS transistor 406 is controlled by an NMOS sense amplifier control signal SAN. As the first PMOS sense amplifier control signal SAP1 is activated to high level, power source voltage VDD is carried to a sense amplifier as a PMOS sense amplifier driving voltage CSP. Then, the second PMOS sense amplifier control signal SAP2 is activated to high level. And, inner power supply voltage VDL relatively lower than VDD is carried to the sense amplifier as PMOS sense amplifier driving voltage CSP. Namely, after the sense amplifier has been overdriven by power supply voltage VDD having relatively high voltage level, the sense amplifier is driven normally by the following inner power supply voltage VDL. During this procedure, as the NMOS sense amplifier control signal SAN maintains high level, ground voltage VSS as NMOS sense amplifier driving voltage CSN is carried to the sense amplifier.

In the sense amplifier control circuit of the related art, the NMOS sense amplifier control signal SAN, first and second PMOS sense amplifier control signals SAP1 and SAP2 are generated from the first NMOS sense amplifier enabling bar signal SAEN1B, first and second PMOS sense amplifier enabling bar signals SAEP1B and SAEP2B in use of the sense amplifier enabling bar signal SAEB. Therefore, the circuit requires many logic gates as well as many signal transferring paths, thereby increasing a chip size.

SUMMARY OF THE INVENTION

Accordingly, the present invention is directed to a sense amplifier control circuit in semiconductor memory that substantially obviates one or more of the problems due to limitations and disadvantages of the related art.

The object of the present invention is to provide a sense amplifier control circuit in semiconductor memory which reduces gates and signal transferring paths for the circuit by generating an NMOS sense amplifier control signal SAN, and first and second PMOS sense amplifier control signals SAP1 and SAP2, which are required for controlling a sense amplifier, in use of a first NMOS sense amplifier enabling bar signal SAEN1B and PMOS sense amplifier enabling bar signal SAEP1B only. Accordingly, the present invention achieves normal operation of a sense amplifier control circuit with 7 logic gates which are less than those in the related art and connected one another organically. Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a first logic gate supplied with a pair of amplifier enabling bar signals which are applied to the first logic gate in order with time difference wherein the first logic gate generates a signal of logic value 0 when at least one of the amplifier enabling signals has logic value 1, a second logic gate generating a first NMOS sense amplifier enabling bar signal of high level when an output of the first logic gate has logic value 0 and the sense amplifier enabling bar signal has logic value 1, a third logic gate generating a first PMOS sense amplifier enabling bar signal of high level when at least one of an output of the first logic gate and the sense amplifier enabling bar signal has logic value 1, a fourth logic gate generating a signal of logic value 1 when at least one of a plurality of MAT selection bar signals has logic value 0, a fifth logic gate generating a signal of logic value 1 when the first NMOS sense amplifier enabling bar signal has logic value 0 and an output of the fourth logic gate has logic value 1, a sixth logic gate generating a signal of logic value 0 when the first PMOS sense amplifier enabling bar signal has logic value 1 and an output of the fourth logic gate has logic value 0, and a seventh logic gate generating a second PMOS sense amplifier control signal of logic value 1 when both outputs of the fifth and sixth logic gates have logic value 1.

In another aspect, the present invention includes a delaying part receiving a sense amplifier enabling bar signal wherein the delaying part delays the sense amplifier enabling bar signal for a predetermined time interval, a first NOR gate receiving the sense amplifier enabling bar signal and an output of the delaying part, a first NAND gate receiving an inverted output of the NOR gate and the sense amplifier enabling bar signal, a first inverter generating a first NMOS sense amplifier enabling bar signal by inverting an output of the first NAND gate, a second NOR gate receiving an output of the first NOR gate and the sense amplifier enabling bar signal, a second inverter generating a first PMOS sense amplifier enabling bar signal by inverting output of the second NOR gate, a second NAND gate receiving a plurality of MAT selection bar signal, a third inverter inverting the first NMOS sense amplifier enabling bar signal, a third NAND gate receiving outputs of the second NAND gate and third inverter, a fourth inverter inverting an output of the third NAND gate, a fourth NAND gate receiving an output of the second NAND gate and the first PMOS sense amplifier enabling bar signal, a fifth inverter inverting an output of the fourth NAND gate, a sixth inverter inverting an output of the fifth inverter, a fifth NAND gate receiving outputs of the fourth inverter and sixth inverter, a seventh inverter generating a second PMOS sense amplifier control signal by inverting an output of the fifth NAND gate, an eighth inverter generating an NMOS sense amplifier control signal by inverting an output of the fourth invert, and a ninth inverter generating a first PMOS sense amplifier control signal by inverting an output of the sixth inverter.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

In the drawings.

DETAILED DESCRIPTION OF PREFERRED EMBODIMENTS

Reference will now be made in detail to the preferred embodiments of the present invention, examples of which are illustrated in the accompanying drawings.

Figure 5:
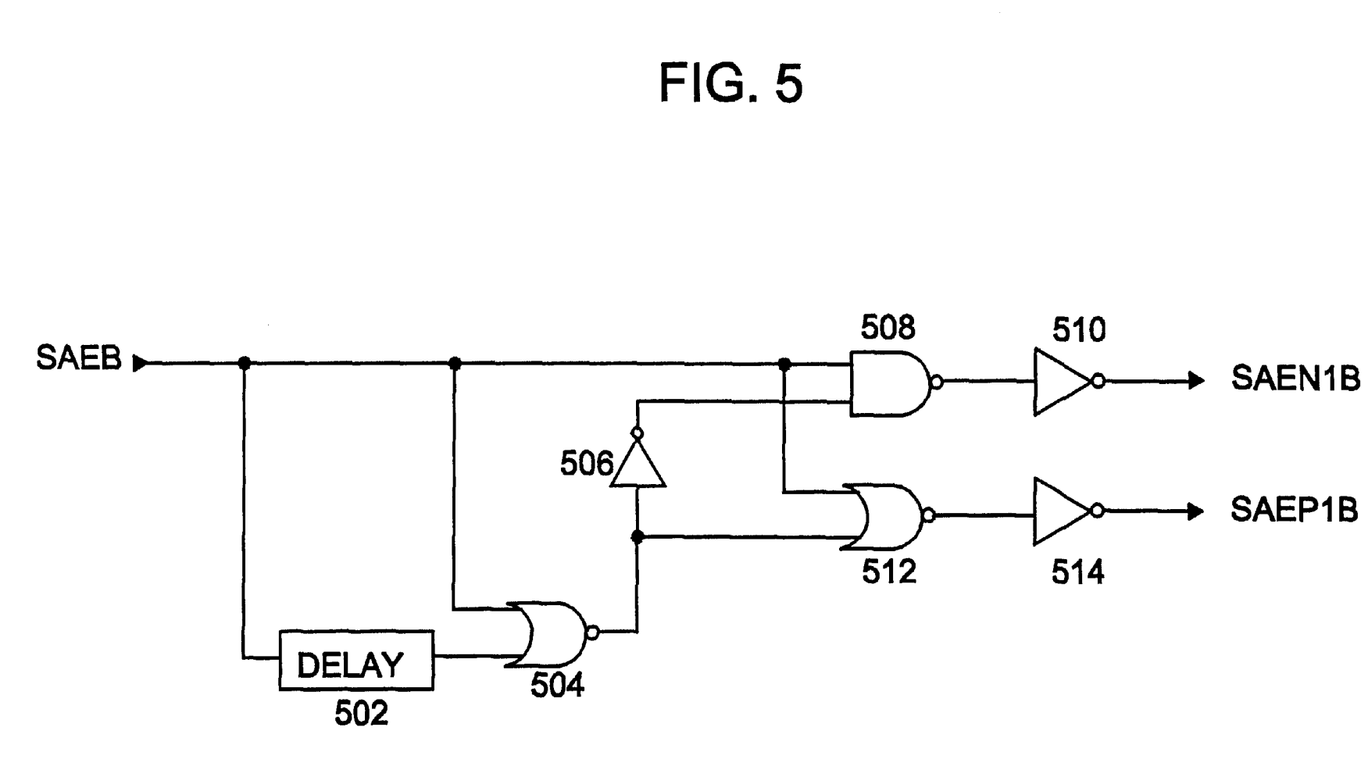
FIG. 5 and FIG. 6 show sense amplifier control circuits in semiconductor memory according to the present invention.
Figure 6:
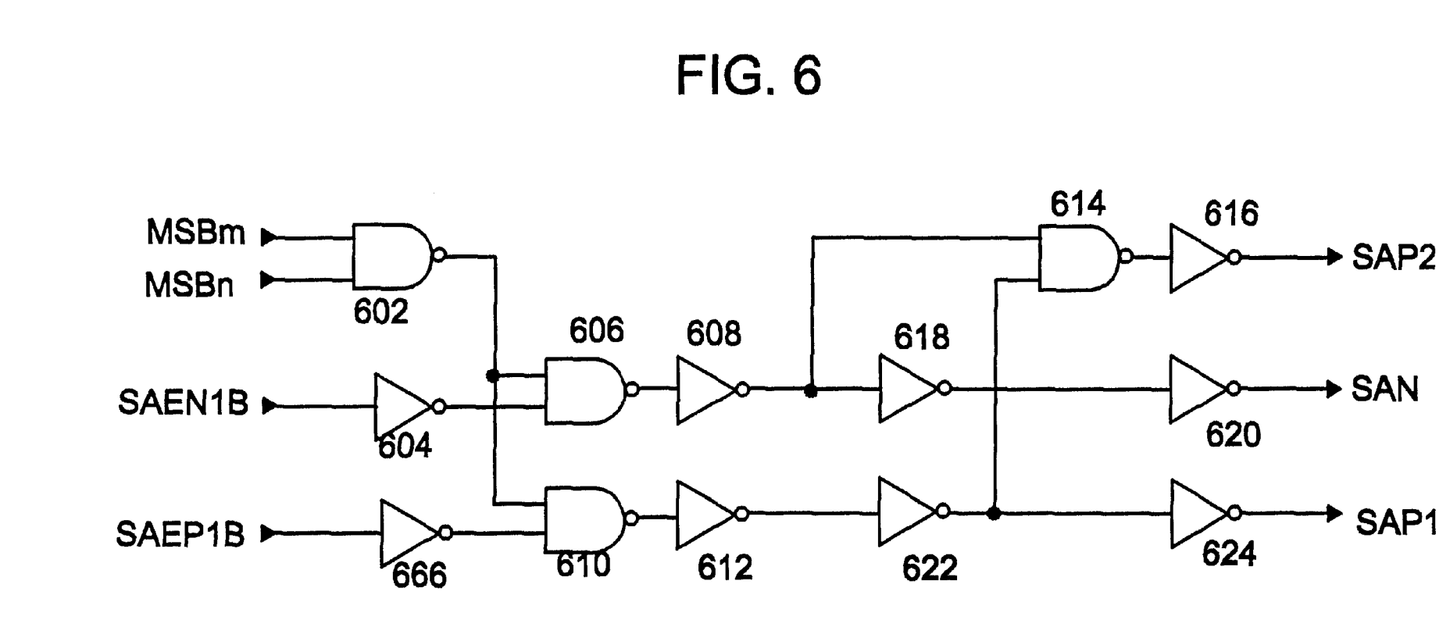

FIG. 5 and FIG. 6 show sense amplifier control circuits in semiconductor memory according to the present invention.

FIG. 5 is a circuit for generating a first NMOS sense amplifier enabling bar signal SAEN1B and first PMOS sense amplifier enabling bar signal SAEP1B, in use of a sense amplifier enabling bar signal SAEB.

FIG. 6 is a circuit for generating an NMOS sense amplifier control signal SAN, first PMOS sense amplifier control signal SAP1, and second PMOS sense amplifier control signal SAP2 in use of the signals generated in FIG. 5.

Referring to FIG. 5, a delaying part 502 receives and delays a sense amplifier enabling bar signal SAEB for the duration of a time interval. A NOR gate 504 receives the sense amplifier enabling bar signal SAEB and an output of the delaying part 502. A NAND gate 508 receives a signal which is produced by inverting an output of the NOR gate 504 by an inverter 506 and the sense amplifier enabling bar signal SAEB. An inverter 510 outputs a first NMOS sense amplifier enabling bar signal SAEN1B by inverting an output of the NAND gate 508. A NOR gate 512 receives the output of the NOR gate 504 and the sense amplifier enabling bar signal SAEB. An inverter 514 outputs a first PMOS sense amplifier enabling bar signal SAEP1B by inverting an output of the NOR gate 512.

When the sense amplifier enabling bar signal SAEB goes high level to low, the output of the NAND gate 508 is fixed to high level. For this reason, the first NMOS sense amplifier enabling bar signal SAEN1B outputted from the inverter 510 is fixed to low level. Namely, the first NMOS sense amplifier enabling bar signal SAEN1B maintains low level as long as the sense amplifier enabling bar signal SAEB stays at low level.

Accordingly, when the sense amplifier enabling bar signal SAEB is at low level, the output of the NOR gate 512 depends on the output of another NOR gate 504. As the NOR gate 504 receives the sense amplifier enabling bar signal SAEB with time difference, a signal of high level is generated after the delayed time in the delaying part 502 even though the sense amplifier enabling bar signal SAEB goes down to low level. Therefore, having become low level like SAEB first, the output of the NOR gate 512 goes up to high level after the delayed time has elapsed.

Referring to FIG. 6, a NAND gate 602 receives a plurality of MAT selection bar signals MSBm and MSBn. An inverter 604 inverts the first NMOS sense amplifier enabling bar signal SAEN1B. A NAND gate 606 receives outputs of the NAND gate 602 and inverter 604. An inverter 608 inverts an output of the NAND gate 606. A NAND gate 610 receives an output of the NAND gate 602 and a signal that is generated by having the first PMOS sense amplifier enabling bar signal SAEP1B inverted by an inverter 666. An inverter 612 inverts an output of the NAND gate 610. An inverter 622 inverts an output of the inverter 612. A NAND gate 614 receives outputs of the NAND gate 608 and inverter 622. An inverter 616 generates a second PMOS sense amplifier control signal SAP2 by inverting an output of the NAND gate 614. Two inverters 618 and 620 connected each other in series delays an output of the inverter 608, generating an NMOS sense amplifier control signal SAN. An inverter 624 generates a first PMOS sense amplifier control signal SAP1 by inverting an output of the inverter 622.

Once one of the MAT selection bar signal is activated to low level, the output of the NAND gate 602 is fixed to high level. Therefore, the outputs of the NAND gates 606 and 610 depend on logic values of the first NMOS and PMOS sense amplifier enabling bar signals SAEN1B and SAEP1B, respectively. As the first NMOS sense amplifier enabling bar signal SAEN1B having been inverted by the inverter 604 is inputted to the NAND gate 606, the output of the NAND gate 606 has the same logic value of the first sense amplifier enabling bar signal SAEB. However, the output of the NAND gate 610 has a logic value opposite to that of the second PMOS sense amplifier enabling bar signal SAEP2B.

The NAND gate 614 receives a signal which is produced by having the output of the NAND gate 606 inverted by the inverter 608 as well as the output of the NAND gate 610. Therefore, the second PMOS sense amplifier control signal SAP2 is also activated to low level when the first NMOS and PMOS sense amplifier enabling bar signals SAEN1B and SAEP1B are at high and low level, respectively.

The NMOS sense amplifier control signal SAN outputted from the inverter 620 is generated by having the output of the NAND gate 606 inverted. Accordingly, the NMOS sense amplifier control signal SAN is activated to high level when the first NMOS sense amplifier enabling bar signal SAEN1B is at low level.

The first PMOS sense amplifier control signal SAP1 outputted from the inverter 624 is generated by having the output of the NAND gate 610 inverted. Accordingly, the first PMOS sense amplifier control signal SAP1 is also activated to high level when the first PMOS sense amplifier enabling bar signal SAEP1B is at low level.

Figure 7:
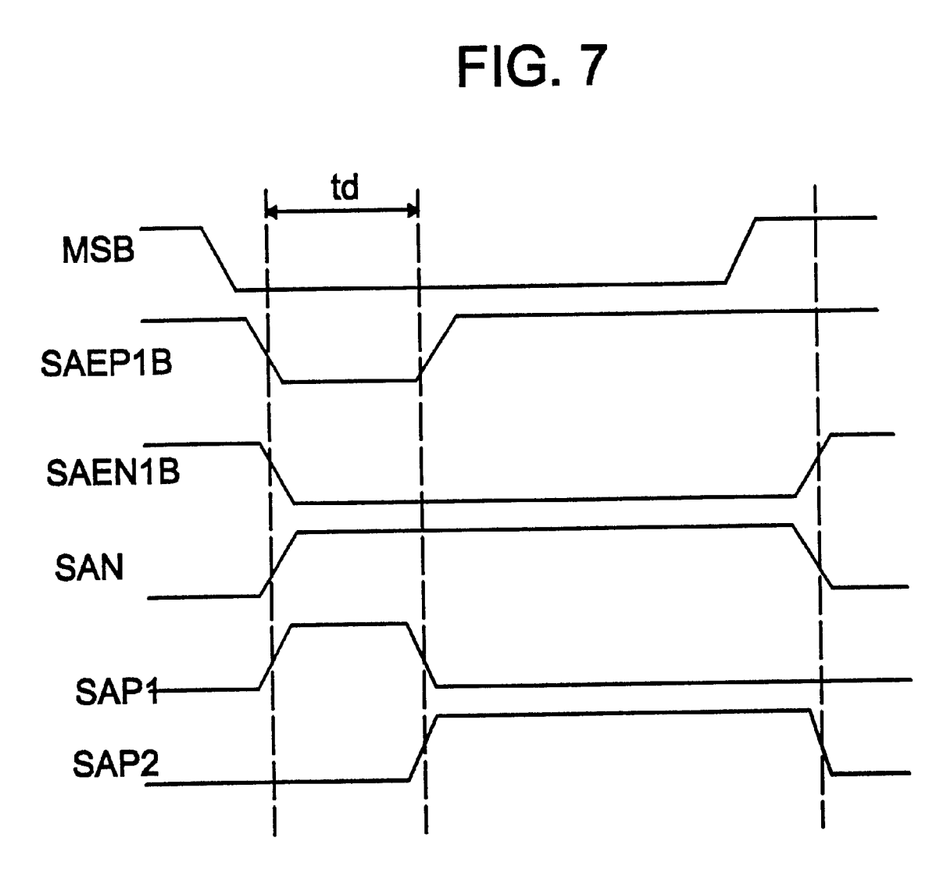
FIG. 7 shows a timing diagram of operational characteristics of a sense amplifier control circuit in semiconductor memory according to the present invention.

FIG. 7 shows a timing diagram of operational characteristics of a sense amplifier control circuit in semiconductor memory according to the present invention.

Referring to FIG. 7, when a MAT selection bar signal MSB goes down high level to low, a sense amplifier enabling bar signal SAEB goes down to low level as well. Provided that the sense amplifier enabling bar signal SAEB goes down to low level, Both first PMOS and NMOS sense amplifier enabling bar signals SAEP1B and SAEN1B go down to low level.

After delayed time td of the delaying part 102 has elapsed, the first PMOS sense amplifier enabling bar signal SAEP1B goes up to high level again, while the first NMOS sense amplifier enabling bar signal SAEN1B maintains low level.

As the first NMOS sense amplifier enabling bar signal SAEN1B goes down to low level, an NMOS sense amplifier control signal SAN goes up to high level. While the first PMOS sense amplifier enabling bar signal SAEP1B stay at low level, a first PMOS sense amplifier control signal SAP1 keeps high level.

As shown in FIG. 7, the first and second PMOS sense amplifier control signals SAP1 and SAP2 are activated to high level in order. The activated interval of the first PMOS sense amplifier control signal SAP1 is relatively shorter than that of the second SAP2. This is because the sense amplifier is supplied with normal voltage through the second PMOS sense amplifier control signal SAP2 after the driving force of the sense amplifier has been greatly improved owing to overdriven voltage applied to the sense amplifier by the first PMOS sense amplifier control signal SAP1.

VDD and VDL are carried to the sense amplifier in order as the NMOS, and first and PMOS sense amplifier control signals SAN, SAP1, and SAP2 are transferred to the sense amplifier driving circuit in FIG. 4.

Accordingly, the present invention of a sense amplifier control circuit in semiconductor memory which reduces gates and signal transferring paths for the circuit by generating an NMOS sense amplifier control signal SAN, and first and second PMOS sense amplifier control signals SAP1 and SAP2, which are required for controlling a sense amplifier, in use of a first NMOS sense amplifier enabling bar signal SAEN1B and PMOS sense amplifier enabling bar signal SAEP1B only.

It will be apparent to those skilled in the art that various modifications and variations can be made in a sense amplifier control circuit in semiconductor memory of the present invention without departing from the spirit or scope of the inventions. Thus, it is intended that the present invention cover the modifications and variations of this invention provided they come within the scope of the appended claims and equivalents.

What is claimed is:

1. A sense amplifier control circuit in semiconductor memory comprising:

a first logic gate supplied with a pair of sense amplifier enabling bar signals which are applied to the first logic gate in order with time difference, the first logic gate generating a signal of logic value 0 when at least one of the sense amplifier enabling bar signals has logic value 1;

a second logic gate generating a first NMOS sense amplifier enabling bar signal of high level when an output of the first logic gate has logic value 0 and a sense amplifier enabling bar signal has logic value 1;

a third logic gate generating a first PMOS sense amplifier enabling bar signal of high level when at least one of an output of the first logic gate and a sense amplifier enabling bar signal has logic value 1;

a fourth logic gate generating a signal of logic value 1 when at least one of a plurality of MAT selection bar signals has logic value 0;

a fifth logic gate generating a signal of logic value 1 when the first NMOS sense amplifier enabling bar signal has logic value 0 and an output of the fourth logic gate has logic value 1;

a sixth logic gate generating a signal of logic value 0 when the first PMOS sense amplifier enabling bar signal has logic value 1 and an output of the fourth logic gate has logic value 0; and a seventh logic gate generating a second PMOS sense amplifier control signal of logic value 1 when outputs of the fifth and sixth logic gates both have logic value 1.

2. The sense amplifier control circuit in semiconductor memory according to claim 1, wherein a sense amplifier enabling bar signal is generated from the MAT selection bar signal.

3. The sense amplifier control circuit in semiconductor memory according to claim 1, wherein an output of the fifth logic gate is an NMOS sense amplifier control signal which controls that ground voltage is outputted from a driving part of a sense amplifier to be carried to a source of an NMOS transistor in the sense amplifier.

4. The sense amplifier control circuit in semiconductor memory according to claim 1, wherein an output of the sixth logic gate is a first PMOS sense amplifier control signal which controls that a first power supply voltage is outputted from a driving part of the sense amplifier to be carried to a source of a PMOS transistor in the sense amplifier.

5. The sense amplifier control circuit in semiconductor memory according to claim 1, wherein the second PMOS sense amplifier control signal controls that a second power supply voltage is outputted from the driving part of the sense amplifier to be carried to the source of the PMOS transistor in the sense amplifier.

6. The sense amplifier control circuit in semiconductor memory according to either claim 4 or claim 5, wherein level of the first power supply voltage is higher than that of the second power supply voltage.

7. The sense amplifier control circuit in semiconductor memory according to either claim 4 or claim 5, wherein the first power supply voltage activates the second power supply voltage in order.

8. A sense amplifier control circuit in semiconductor memory comprising:

a delaying part receiving a sense amplifier enabling bar signal wherein the delaying part delays the sense amplifier enabling bar signal for a predetermined time interval;

a first NOR gate receiving the sense amplifier enabling bar signal and an output of the delaying part;

a first NAND gate receiving an inverted output of the NOR gate and the sense amplifier enabling bar signal;

a first inverter generating a first NMOS sense amplifier enabling bar signal by inverting an output of the first NAND gate;

a second NOR gate receiving an output of the first NOR gate and the sense amplifier enabling bar signal;

a second inverter generating a first PMOS sense amplifier enabling bar signal by inverting output of the second NOR gate;

a second NAND gate receiving a plurality of MAT selection bar signal;

a third inverter inverting the first NMOS sense amplifier enabling bar signal;

a third NAND gate receiving outputs of the second NAND gate and third inverter;

a fourth inverter inverting an output of the third NAND gate;

a fourth NAND gate receiving an output of the second NAND gate and the first PMOS sense amplifier enabling bar signal;

a fifth inverter inverting an output of the fourth NAND gate;

a sixth inverter inverting an output of the fifth inverter;

a fifth NAND gate receiving outputs of the fourth inverter and sixth inverter;

a seventh inverter generating a second PMOS sense amplifier control signal by inverting an output of the fifth NAND gate;

an eighth inverter generating an NMOS sense amplifier control signal by inverting an output of the fourth invert; and a ninth inverter generating a first PMOS sense amplifier control signal by inverting an output of the sixth inverter.

9. The sense amplifier control circuit in semiconductor memory according to claim 8, wherein the sense amplifier enabling bar signal is generated from the MAT selection bar signal.

10. The sense amplifier control circuit in semiconductor memory according to claim 8, wherein the NMOS sense amplifier control signal controls that ground voltage is outputted from the driving part of a sense amplifier to be carried to a source of an NMOS transistor in the sense amplifier.

11. The sense amplifier control circuit in semiconductor memory according to claim 8, wherein the first PMOS sense amplifier control signal controls that a first power supply voltage is outputted from the driving part of the sense amplifier to be carried to a source of a PMOS transistor in the sense amplifier.

12. The sense amplifier control circuit in semiconductor memory according to claim 8, wherein the second PMOS sense amplifier control signal controls that a second power supply voltage is outputted from the driving part of the sense amplifier to be carried to the source of the PMOS transistor in the sense amplifier.

13. The sense amplifier control circuit in semiconductor memory according to either claim 11 or claim 12, wherein level of the first power supply voltage is higher than that of the second power supply voltage.

14. The sense amplifier control circuit in semiconductor memory according to either claim 11 or claim 12, wherein the first power supply voltage activates the second power supply voltage in order.

* * * * *